(12) United States Patent
Hsu et al.

(10) Patent No.: US 8,421,543 B2
(45) Date of Patent: Apr. 16, 2013

(54) CRYSTAL OSCILLATOR AND METHOD FOR MANUFACTURING THE SAME

(75) Inventors: Yu-Wen Hsu, Tainan (TW); Lung-Tai Chen, Kaohsiung (TW); Tzung-Ching Lee, Hsinchu County (TW); Chao-Ta Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 5 days.

(21) Appl. No.: 13/115,112

(22) Filed: May 25, 2011

(65) Prior Publication Data

US 2012/0154068 A1 Jun. 21, 2012

(30) Foreign Application Priority Data

Dec. 17, 2010 (TW) .................................. 99144530 A

(51) Int. Cl.
- H03B 1/00 (2006.01)
- H03B 5/32 (2006.01)
- H01L 41/053 (2006.01)

(52) U.S. Cl.
USPC ............................................. 331/68; 331/158

(58) Field of Classification Search .................. 331/158, 331/68; 310/348
See application file for complete search history.

(56) References Cited

U.S. PATENT DOCUMENTS

| | | | |
|---|---|---|---|
| 3,969,640 A | 7/1976 | Staudte | |
| 4,110,655 A | 8/1978 | Hata et al. | |
| 4,191,905 A | 3/1980 | Yasuda et al. | |
| 4,266,156 A | 5/1981 | Kizaki | |
| 4,421,621 A | 12/1983 | Fujii et al. | |
| 5,109,176 A | 4/1992 | Nguyen et al. | |
| 5,631,609 A | 5/1997 | Oka et al. | |
| 5,920,142 A | 7/1999 | Onishi et al. | |
| 6,229,249 B1 | 5/2001 | Hatanaka et al. | |
| 6,229,469 B1 | 5/2001 | Gaudet | |
| 6,310,421 B2 | 10/2001 | Morishima | |
| 6,445,254 B1 | 9/2002 | Shibuya et al. | |
| 6,452,460 B2 | 9/2002 | Oda | |

(Continued)

FOREIGN PATENT DOCUMENTS

| | | |
|---|---|---|
| CN | 1642004 | 7/2005 |
| TW | I248719 | 2/2006 |

(Continued)

OTHER PUBLICATIONS

Kaajakari et al., "Stability of wafer level vacuum encapsulated single-crystal silicon resonators", Sensors and Actuators A: Physical, vol. 130-131, Aug. 14, 2006, pp. 42-47.

(Continued)

Primary Examiner — Joseph Chang
(74) Attorney, Agent, or Firm — Jianq Chyun IP Office

(57) ABSTRACT

A crystal oscillator includes a cover, a crystal blank and an Integrated Circuit (IC) chip. The cover has a surface, a cavity formed in the surface, a plurality of conductive contacts and a conductive sealing ring. The conductive contacts are disposed on the surface, and the conductive sealing ring is disposed on the surface and surrounds the conductive contacts. The IC chip is connected to the conductive contacts and the conductive sealing ring, and forms a hermetic chamber with the cover and the conductive sealing ring. The crystal blank is located in the hermetic chamber, and is electrically connected to the IC chip. Furthermore, a method for manufacturing a crystal oscillator is also provided.

17 Claims, 16 Drawing Sheets

U.S. PATENT DOCUMENTS

| | | |
|---|---|---|
| 6,456,168 B1 | 9/2002 | Luff |
| 6,531,807 B2 | 3/2003 | Tanaka et al. |
| 6,545,392 B2 | 4/2003 | Kawauchi et al. |
| 6,734,605 B2 | 5/2004 | Kinoshita |
| 6,762,537 B1 | 7/2004 | Kikushima |
| 6,798,307 B2 | 9/2004 | Mizumura et al. |
| 6,833,654 B2 | 12/2004 | Rubach |
| 6,914,367 B2 | 7/2005 | Furukawa |
| 6,917,142 B2 | 7/2005 | Koyama et al. |
| 6,967,537 B2 | 11/2005 | Harima et al. |
| 6,998,925 B2 | 2/2006 | Harima et al. |
| 7,015,627 B2 | 3/2006 | Serizawa |
| 7,067,966 B2 | 6/2006 | Tanaya |
| 7,098,580 B2 | 8/2006 | Sasagawa et al. |
| 7,123,107 B2 | 10/2006 | Koyama et al. |
| 7,123,108 B2 | 10/2006 | Isimaru |
| 7,135,810 B2 | 11/2006 | Okajima |
| 7,145,416 B2 | 12/2006 | Mizuno |
| 7,157,836 B2 | 1/2007 | Kinoshita |
| 7,211,934 B2 | 5/2007 | Fujiwara et al. |
| 7,215,065 B2 | 5/2007 | Masuko et al. |
| 7,218,036 B2 | 5/2007 | Shimodaira et al. |
| 7,247,978 B2 | 7/2007 | Robinson et al. |
| 7,256,658 B2 | 8/2007 | Asamura |
| 7,256,659 B2 | 8/2007 | Mizumura et al. |
| 7,266,869 B2 | 9/2007 | Hatanaka et al. |
| 7,271,525 B2 | 9/2007 | Byers et al. |
| 7,304,413 B2 | 12/2007 | Kasahara |
| 7,339,309 B2 | 3/2008 | Okazaki et al. |
| 7,378,780 B2 | 5/2008 | Mizumura et al. |
| 7,408,291 B2 | 8/2008 | Koyama et al. |
| 7,436,105 B2 | 10/2008 | Takebayashi |
| 7,446,460 B2 | 11/2008 | Yamamoto |
| 7,456,552 B2 | 11/2008 | Chiba et al. |
| 7,468,574 B2 | 12/2008 | Horie et al. |
| 7,489,208 B2 | 2/2009 | Moriya |
| 7,522,006 B2 | 4/2009 | Mizumura et al. |
| 7,528,529 B2 | 5/2009 | Yamaguchi et al. |
| 7,551,040 B2 | 6/2009 | Harima |
| 7,557,493 B2 | 7/2009 | Fujimoto |
| 7,573,341 B2 | 8/2009 | Moriya |
| 7,576,476 B2 | 8/2009 | Koyama et al. |
| 7,602,107 B2 | 10/2009 | Moriya et al. |
| 7,679,153 B2 | 3/2010 | Ito et al. |
| 7,702,053 B2 | 4/2010 | Chen et al. |
| 7,710,002 B2 | 5/2010 | Horie et al. |
| 7,714,484 B2 | 5/2010 | Hara et al. |
| 8,069,549 B2 * | 12/2011 | Nagano et al. ................. 29/594 |
| 2007/0176517 A1 | 8/2007 | Moriya et al. |

FOREIGN PATENT DOCUMENTS

| | | |
|---|---|---|
| TW | I278178 | 4/2007 |
| TW | 200824259 | 6/2008 |
| TW | 201021400 | 6/2010 |

OTHER PUBLICATIONS

Koskenvuori et al., "Long-term stability of single-crystal silicon microresonators", Sensors and Actuators A: Physical, vol. 115, Issue 1, Sep. 15, 2004, pp. 23-27.

Kim et al., "New approach for wafer level crystal unit package", Electronics Packaging Technology Conference, 2008. EPTC 2008. 10th, Dec. 9, 2008, pp. 1247-1252.

* cited by examiner

CRYSTAL OSCILLATOR AND METHOD FOR MANUFACTURING THE SAME

CROSS-REFERENCE TO RELATED APPLICATION

This application claims the priority benefit of Taiwan application serial no. 99144530, filed on Dec. 17, 2010. The entirety of the above-mentioned patent application is hereby incorporated by reference herein and made a part of this specification.

TECHNICAL FIELD

The disclosure relates to an electronic component and a method for manufacturing the same, and more particularly to a crystal oscillator and a method for manufacturing the same.

BACKGROUND

In the Computer, Communications and Consumer (3C) electronic product market, integration of wireless communication and broadband network is an inevitable trend. With the increasing complexity of the system, the high system stability is also required. Moreover, to ensure an Integrated Circuit (IC) chip to operate correctly, a highly stable oscillator (such as a crystal oscillator) must be employed to provide a precise clock signal.

An oscillator, applicable to a 3C electronic product, needs to be light, thin, short, and small, so that the volume of oscillator must be minimized and manufacturing cost must be low. Therefore, how to integrate an oscillating element (such as a crystal plate) and an IC chip becomes a major technical challenge for developing a miniature crystal oscillator at a low cost.

SUMMARY

A crystal oscillator is introduced herein. The crystal oscillator comprises a cover, a crystal blank and an Integrated Circuit (IC) chip. The cover comprises a first surface, a second surface, a cavity, a first cover conductive layer, an element conductive contact, a plurality of conductive contacts and a conductive sealing ring. The second surface is opposite to the first surface. The cavity is formed in the first surface and comprises a bottom surface and a side surface surrounding the bottom surface. The first cover conductive layer is disposed on the bottom surface of the cavity The element conductive contact is disposed on the first cover conductive layer. The conductive contacts are disposed on the first surface. The conductive sealing ring is disposed on the first surface and surrounds the conductive contacts. The crystal blank is connected to the element conductive contact. The IC chip comprises a plurality of conductive bonding pads and a conductive bonding ring. The conductive bonding pads and the conductive bonding ring are disposed on a surface of the IC chip. The cover and IC chip are bonded by connecting the conductive sealing ring of the cover and the conductive bonding ring of the IC chip to form a hermetic chamber surrounding the crystal blank.

A crystal oscillator is introduced herein. The crystal oscillator comprises a cover, a crystal blank and an Integrated Circuit (IC) chip. The cover comprises a first surface, a second surface, a cavity, a plurality of conductive contacts and a conductive sealing ring. The second surface is opposite to the first surface. The cavity is formed in the first surface. The conductive contacts are disposed on the first surface. The conductive sealing ring is disposed on the first surface and surrounds the conductive contacts. The IC chip comprises a plurality of conductive bonding pads, a conductive bonding ring and an element conductive contact. The conductive bonding pads, the conductive bonding ring and the element conductive contact are disposed on a surface of the IC chip. The cover and IC chip are bonded by connecting the conductive sealing ring of the cover and the conductive bonding ring of the IC chip to form a hermetic chamber. The crystal blank is located in the hermetic chamber and is connected to the element conductive contact.

A crystal oscillator is introduced herein. The crystal oscillator comprises a cover, an Integrated Circuit (IC) chip, a conductive layer, an element conductive contact and a crystal blank. The cover comprises a first surface, a second surface, a cavity, a plurality of conductive contacts and a conductive sealing ring. The second surface is opposite to the first surface. The cavity is formed in the first surface and comprises a bottom surface and a side surface surrounding the bottom surface. The conductive contacts are disposed on the first surface. The conductive sealing ring is disposed on the first surface and surrounds the conductive contacts. The IC chip comprises a plurality of conductive bonding pads and a conductive bonding ring. The conductive bonding pads and the conductive bonding ring are disposed on a surface of the IC chip. The cover and IC chip are bonded by connecting the conductive sealing ring of the cover and the conductive bonding ring of the IC chip to form a hermetic chamber. The conductive layer is disposed in the hermetic chamber and is electrically connected to at least one of the conductive contacts. The element conductive contact is located in the hermetic chamber and is disposed on the conductive layer. The crystal blank is located in the hermetic chamber and is disposed on the element conductive contact.

A method for manufacturing a crystal oscillator is introduced herein. The method comprises the following steps. A cover wafer and a Integrated Circuit (IC) wafer is connected by a conductive sealing ring between the cover wafer and the IC wafer to form a hermetic chamber. A crystal blank is located in the hermetic chamber.

A method for manufacturing a crystal oscillator is introduced herein. The method comprises the following steps. A cover wafer and an Integrated Circuit (IC) wafer is provided. A crystal blank is connected on the cover wafer. The cover wafer and the IC wafer is connected by a conductive sealing ring between the cover wafer and the IC wafer to form a hermetic chamber surrounding the crystal blank.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 3 is a sectional view of a crystal oscillator according to a second embodiment of the disclosure;

FIG. 4 is a sectional view of a crystal oscillator according to a third embodiment of the disclosure;

FIG. 5 is a sectional view of a crystal oscillator according to a fourth embodiment of the disclosure; and FIG. 6 is a sectional view of a crystal oscillator according to a fifth embodiment of the disclosure.

DETAILED DESCRIPTION OF DISCLOSED EMBODIMENTS

Figure 1A:
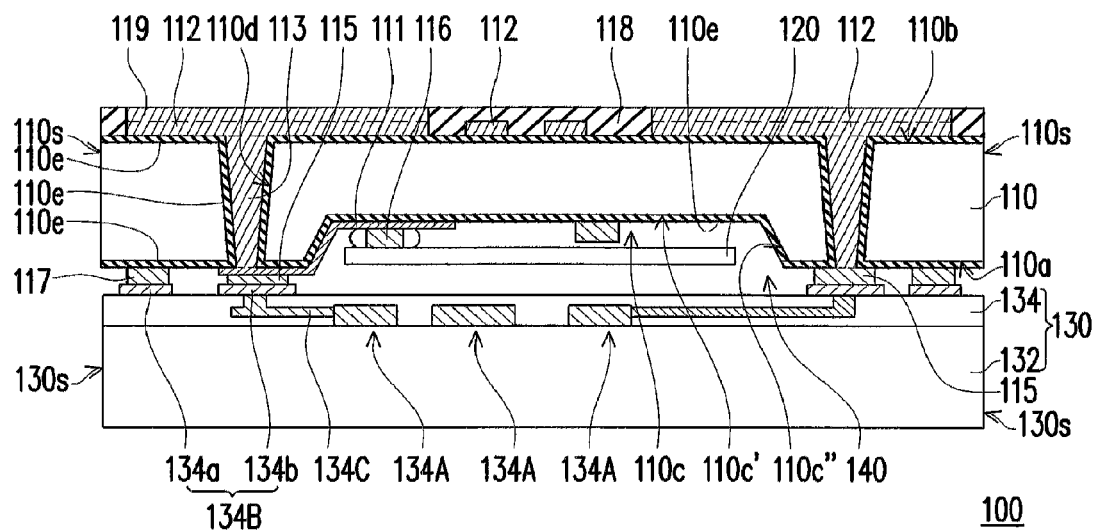
FIG. 1A is a sectional view of a crystal oscillator according to a first embodiment of the disclosure.
Figure 1B:
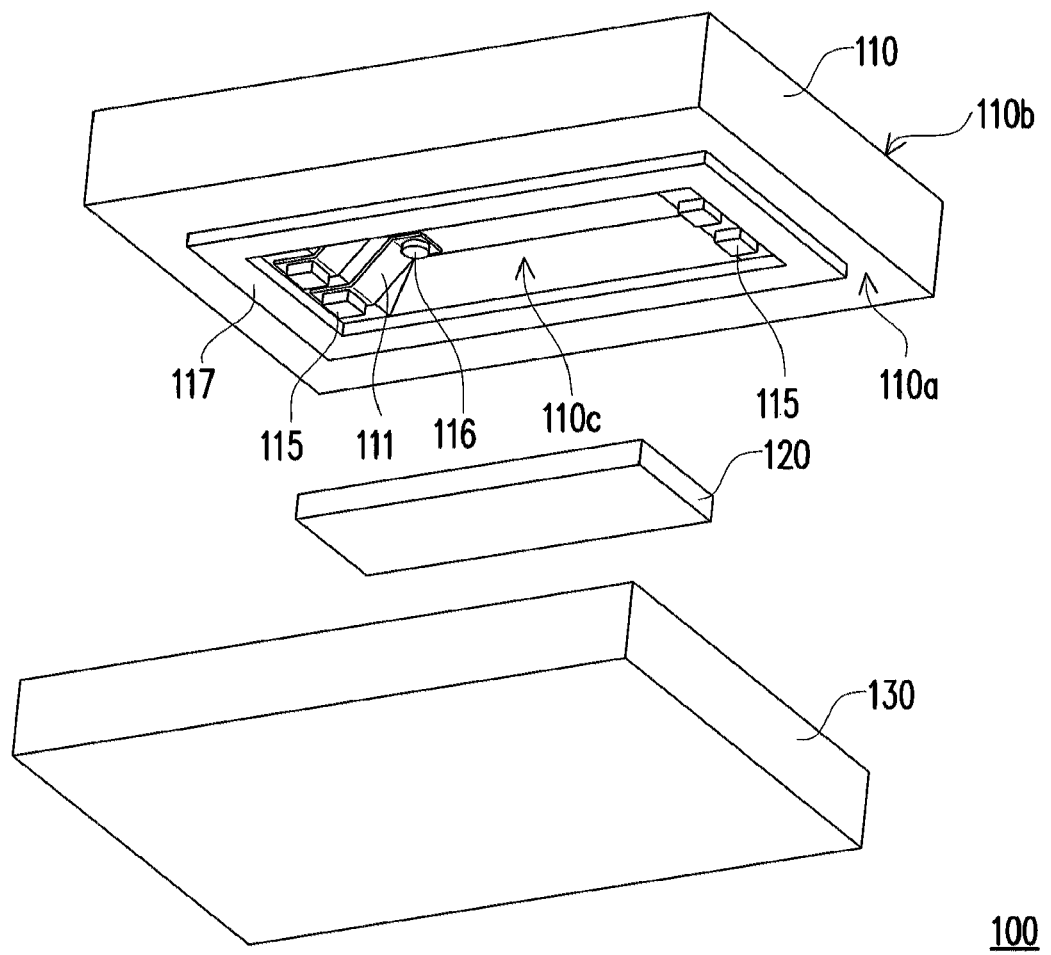
FIG. 1B is an exploded view of the crystal oscillator in FIG. 1A.

FIG. 1A and FIG. 1B are a sectional view and an exploded view of a crystal oscillator according to a first embodiment of the disclosure respectively. Referring to FIG. 1A and FIG. 1B, the crystal oscillator 100 of this embodiment includes a cover 110 with split side surfaces 110s which are formed after wafer dicing process, a crystal blank 120 and an IC chip 130 with split side surfaces 130s which are formed after wafer dicing process. The crystal blank 120 is connected to the cover 110, and the cover 110 is connected to the IC chip 130, so that the crystal blank 120 is located between the cover 110 and the IC chip 130.

The cover 110 has a first surface 110a, a second surface 110b opposite to the first surface 110a, a cavity 110c, a first cover conductive layer 111 and a plurality of conductive pillars 113. The cavity 110c is formed in the first surface 110a and includes a bottom surface 110c' and a side surface 110c" surrounding the bottom surface 110c'. The first cover conductive layer 111 and the crystal blank 120 are both disposed on the bottom surface 110c' of the cavity 110c. And the first cover conductive layer 111 is extended to the first surface 110a for electrical interconnection.

The conductive pillars 113 respectively penetrate the cover 110, and are connected to a second cover conductive layer 112 and a conductive bonding layer 119 disposed on the cover 110, and at least one of the conductive pillars 113 is connected to the first cover conductive layer 111, so as to transmit the signals from the first cover conductive layer 111 to the second cover conductive layer 112 and the conductive bonding layer 119.

The cover 110 further has a conductive contact 115. The conductive contact 115 is disposed between the cover 110 and the chip 130, and is connected to the first cover conductive layer 111 and a conductive bonding pad 134b of the chip 130 respectively. The crystal blank 120 is electrically connected to the first cover conductive layer 111.

The cover 110 further includes an element conductive contact 116. The element conductive contact 116 is disposed on an bottom surface 110c' of the cavity 110c and is connected to the first cover conductive layer 111 located on the bottom surface 110c' of the cavity 110c.

The cover 110 further includes a conductive sealing ring 117. The conductive sealing ring 117 is disposed between the cover 110 and the chip 130, and surrounds the conductive contacts 115 and the first cover conductive layer 111, so that a hermetic chamber is formed between the cover 110 and the chip 130.

In this embodiment, the cover 110 further includes a second cover conductive layer 112. The second cover conductive layer 112 is disposed on the second surface 110b, and is electrically connected to at least one of the conductive pillars 113. The first cover conductive layer 111 can be electrically connected to the second cover conductive layer 112 through the conductive pillar 113.

In this embodiment, the cover 110 further has an insulating layer 118. The insulating layer 118 is disposed on the second surface 110b of the cover 110 and the second cover conductive layer 112, and a portion of the insulating layer 118 is exposed on the second cover conductive layer 112.

In this embodiment, the cover 110 further has at least one conductive bonding layer 119. The conductive bonding layer 119 is disposed on the second surface 110b of the cover 110, and is electrically connected to the conductive pillar 113 through the second cover conductive layer 112.

In this embodiment, a material of the cover 110 includes silicon, glass or other equivalent materials. The cover 110 further includes a plurality of through holes 110d and an insulating layer 110e, the conductive pillars 113 are formed in the through holes 110d, and the insulating layer 110e is disposed on the first surface 110a, the second surface 110b and inner surfaces of the through holes 110d of the cover 110.

In this embodiment, the crystal blank 120 may be a quartz blank, and the IC chip 130 may be an Application Specific Integrated Circuit (ASIC) chip. Definitely, the disclosure is not limited to the above material, and any material conforming to the spirit of the disclosure falls within the innovation spirit of the disclosure.

In this embodiment, the IC chip 130 includes a silicon substrate 132 and an IC layer 134, the IC layer 134 is disposed on the silicon substrate 132, and the IC layer 134 includes a conductive bonding ring 134a and a plurality of conductive bonding pads 134b, the conductive bonding pads 134b are electrically connected to the conductive contacts 115, and the conductive sealing ring 117 is connected to the conductive bonding ring 134a.

In this embodiment, the IC layer 130 includes a plurality of IC areas 134A, a plurality of conductive bonding areas 134B and a plurality of interconnection lines 134C. The conductive bonding areas 134B include the conductive bonding rings 134a and the conductive bonding pad 134b. The interconnection lines 134C are connected to the conductive bonding area 134B and the IC area 134A respectively.

At least one of the IC areas 134A is electrically connected to the conductive bonding pad 134b, then electrically connected to the conductive contact 115, the first cover conductive layer 111 and the element conductive contact 116 in sequence, and finally electrically connected to the crystal blank 120. Furthermore, the IC chip 130 is connected to the conductive sealing ring 117, so that the cover 110, the conductive sealing ring 117 and the IC chip 130 together form a hermetic chamber 140 surrounding the crystal blank 120.

An embodiment of the crystal oscillator according to the disclosure is disclosed above, and an embodiment of a method for manufacturing the crystal oscillator according to the disclosure is disclosed hereinafter.

Figures 1, 2:
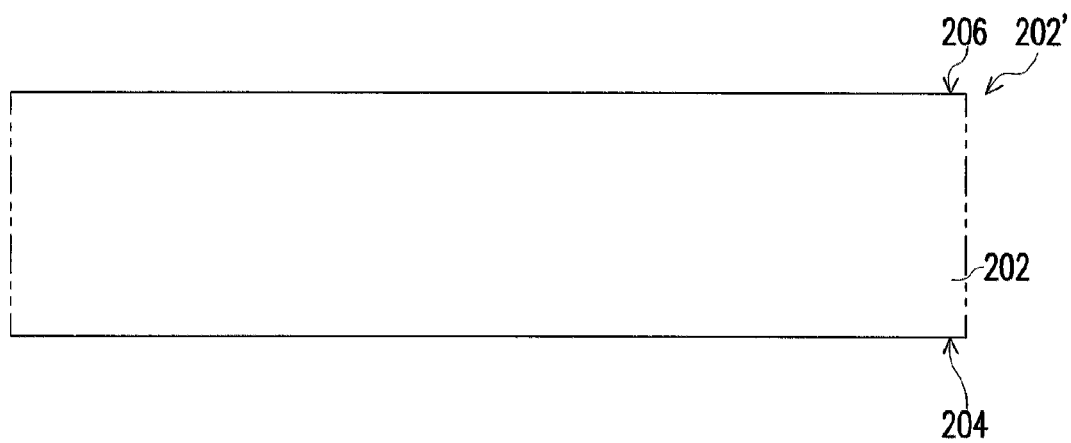
FIG. 2-1 to FIG. 2-19 are sectional views illustrating a method for manufacturing the crystal oscillator according to the first embodiment of the disclosure.
Figure 2:
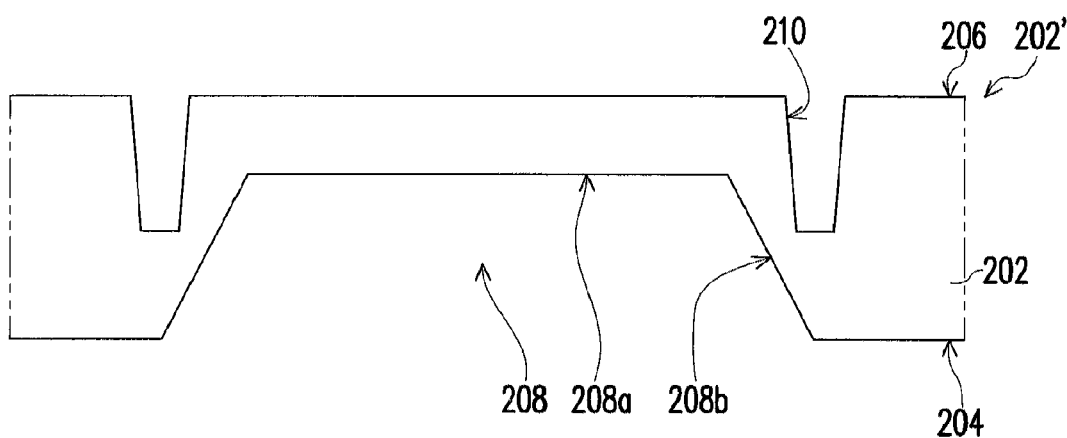

FIG. 2-1 to FIG. 2-19 are sectional views illustrating a method for manufacturing the crystal oscillator according to the first embodiment of the disclosure. A cover wafer 202, such as a silicon wafer, is provided, and the cover wafer 202 has a plurality of covers 202'. The covers 202' are arranged neighbour to each other, and one of the covers 202' is shown in FIG. 2-1. Each of the covers 202' has a first surface 204 and a second surface 206, and the second surface 206 is opposite to the first surface 204.

Referring to FIG. 2-2, a cavity 208 and a plurality of blind holes 210 are formed on each of the cover 202', the cavity 208 is formed in the first surface 204 and includes a bottom surface 208a and a side surface 208b surrounding the bottom surface 208a, and the blind holes 210 are formed in the second surface 206. In this embodiment, the step of forming the cavity 208 and the blind holes 210 includes etching each of the cover 202' and an equivalent etching process or other equivalent manners.

Figures 2, 3:
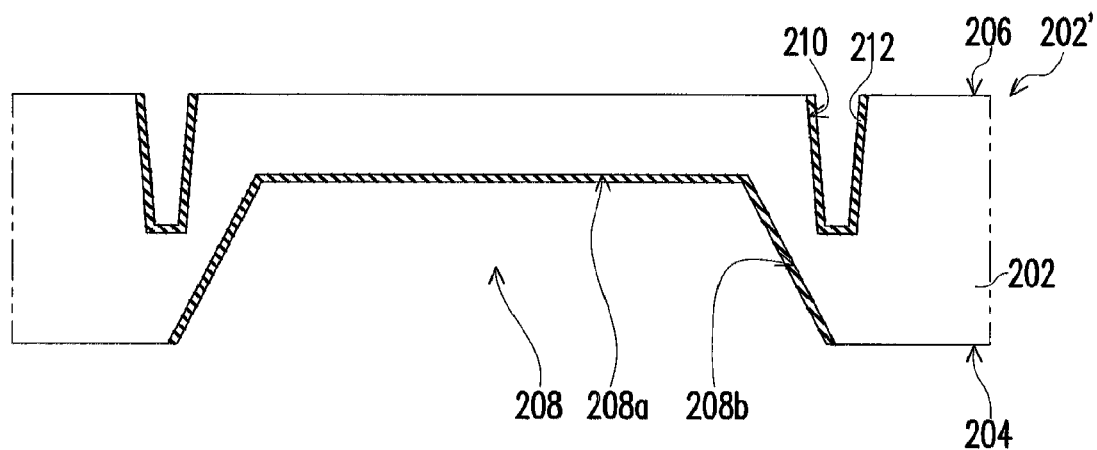

Referring to FIG. 2-3, the bottom surface 208a and the side surface 208b of the cavity 208 and inner surfaces of the blind holes 210 are insulated. In this embodiment, the insulating step includes depositing an oxide 212 as insulator or an equivalent insulating process.

Figures 2, 3, 4:
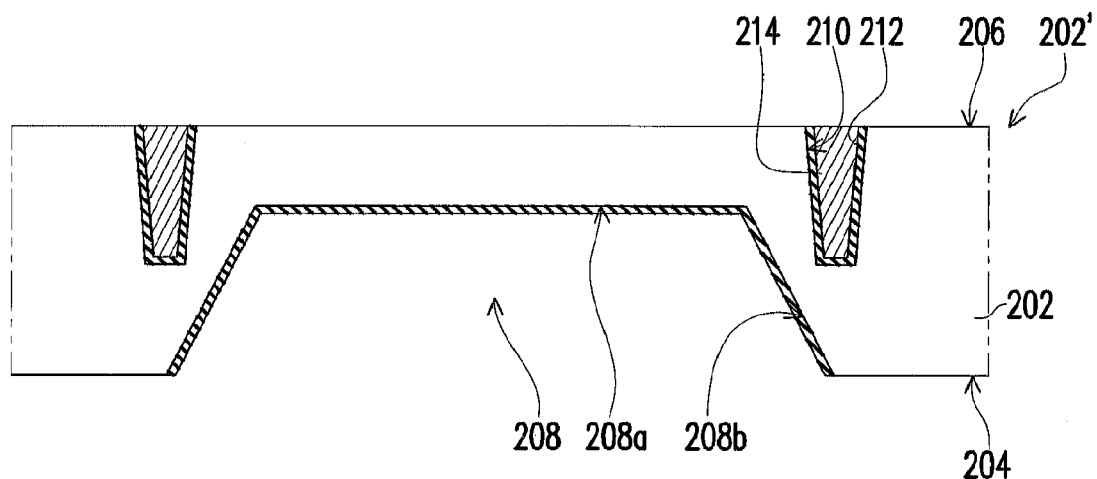

Referring to FIG. 2-4, a plurality of conductive pillars 214 is respectively formed in the blind holes 210, and the conductive pillars 214 are respectively disposed on each of the cover 202'. In this embodiment, the step of forming the conductive pillars 214 includes plating metal or an equivalent process.

Referring to FIG. 2-5, each of the cover 202' is thinned from the first surface 204 thereof, to expose the conductive pillars 214. In this embodiment, the step of thinning the cover wafer 202 includes grinding or an equivalent process.

Referring to FIG. 2-6, the first surface 204 of each of the cover 202' is insulated. In this embodiment, the step of insulating the first surface 204 includes depositing an insulator 216 such as an oxide or an equivalent process.

Referring to FIG. 2-7, part of the deposited insulator 216 that is located on an end surface of the conductive pillar 214 at the first surface 204 is removed to expose the end surface of the conductive pillar 214.

Referring to FIG. 2-8, a first cover conductive layer 218 is formed on the bottom surface 208a of the cavity 208 and the first surface 204, so that the first cover conductive layer 218 is disposed on the bottom surface 208a of the cavity 208 and extends to the first surface 204 through the side surface 208b, in which at least one of the conductive pillars 214 is connected to the first cover conductive layer 218. In this embodiment, the step of forming the first cover conductive layer 218 includes sputtering metal or an equivalent process.

Referring to FIG. 2-9, an element conductive contact 220 is formed on the bottom surface 208a of the cavity 208. A plurality of conductive contacts 222 and a conductive sealing ring 224 are formed on the first surface 204. The element conductive contact 220 is disposed on the first cover conductive layer 218. The conductive contacts 222 are disposed on the first surface 204 of each of the cover 202' and at least one of the conductive contacts 222 is connected to the first cover conductive layer 218. The conductive sealing ring 224 is disposed on the first surface 204 of each of the cover 202' and surrounds the conductive contacts 222. In this embodiment, the step of forming the element conductive contact 220, the conductive contacts 222 and the conductive sealing ring 224 includes plating metal or an equivalent process.

Referring to FIG. 2-10, a crystal blank 228 is connected to the element conductive contact 220, and the crystal blank 228 is located in the cavity 208.

Referring to FIG. 2-11, an IC wafer 230 is provided and has a plurality of IC chips 230'. The IC chips 230' are arranged neighbour to each other and one of the covers 202' is shown. The IC chips 230' are corresponding to the covers 202' respectively. The IC wafer 230 is connected to the cover wafer 202 by the conductive sealing rings 224. Each of the conductive sealing rings 224 is located between the corresponding cover 202' and the corresponding IC chip 230' to form a hermetic chamber 239, which surrounds the crystal blank 228. The IC wafer 230 is also connected to the cover wafer 202 by the conductive contacts 222. In this embodiment, each of the IC chips 230' includes a silicon substrate 232 and an IC layer 234. The IC layer 234 is disposed on the silicon substrate 232. The IC layer 234 includes a plurality of conductive bonding pads 236 and a conductive bonding ring 238, wherein the conductive bonding pads 236 are respectively connected to the conductive contacts 222, and the conductive bonding ring 238 is connected to the conductive sealing ring 224.

Referring to FIG. 2-12, the second surface 206 of each of the cover 202' is insulated. In this embodiment, the step of insulating the second surface 206 includes depositing an insulator 240 such as an oxide or an equivalent process.

Referring to FIG. 2-13, part of the deposited insulator 240 located on an end surface of the conductive pillar 214 at the second surface 206 is removed, to expose the end surface of the conductive pillar 214.

Referring to FIG. 2-14, a second cover conductive layer 242 is formed on the second surface 206 of each of the cover 202', and the second cover conductive layer 242 is connected to at least one of the conductive pillars 214.

Referring to FIG. 2-15, an insulating layer 244 is formed on the second surface 206 of each of the cover 202' and the second cover conductive layer 242.

Referring to FIG. 2-16, the insulating layer 244 is patterned, to expose a part of the second cover conductive layer 242.

Referring to FIG. 2-17, at least one conductive bonding layer 246 is formed on the part of the second cover conductive layer 242 exposed by the insulating layer 244.

Referring to FIG. 2-18, each of the IC chips 230' is thinned. In this embodiment, particularly the silicon substrate 232 of each of the IC chips 230' is thinned.

Referring to FIG. 2-19, a wafer dicing process, such as die sawing process, laser cutting process or an equivalent process, is performed on the cover wafer 202 and the IC wafer 230 connected to the cover wafer 202 shown in FIG. 2-18 so as to form a plurality of crystal oscillators 300. After the wafer dicing process, each of crystal oscillators 300 is split from each other and each of crystal oscillators 300 includes one of the covers 202' with split side surfaces 202' and the corresponding one of the IC chips 230' with split side surfaces 230s' as shown in FIG. 2-19. The cover 202' has four split side surfaces 202' with two of the split side surfaces 202' are shown and labelled, and the IC chips 230' has four split side surfaces 230s' with two of the split side surfaces 230s' are shown and labelled.

Besides the crystal oscillator according to the first embodiment in FIG. 1A, four embodiments of the crystal oscillator are further provided hereinafter.

FIG. 3 is a sectional view of a crystal oscillator according to a second embodiment of the disclosure. Compared with the crystal oscillator 100 in FIG. 1A, in the crystal oscillator 100' in FIG. 3, the conductive pillars 113 penetrate the IC chip 130 and are connected to the conductive bonding pads 134b. Furthermore, in this embodiment, the conductive pillars 113 are further connected to a plurality of chip bonding pads 137 on a back surface 136 of the IC chip 130 respectively, so that an outward electrical connection channel can be formed through the conductive pillars 113.

FIG. 4 is a sectional view of a crystal oscillator according to a third embodiment of the disclosure. Compared with the crystal oscillator 100 in FIG. 1A, in the crystal oscillator 100" in FIG. 4, at least one of the conductive pillars 113 penetrates to the bottom surface 110c' of the cavity 110c, and is connected to the first cover conductive layer 111. The element conductive contact 116 is connected to the first cover conductive layer 111.

Figures 2, 3, 4, 5:
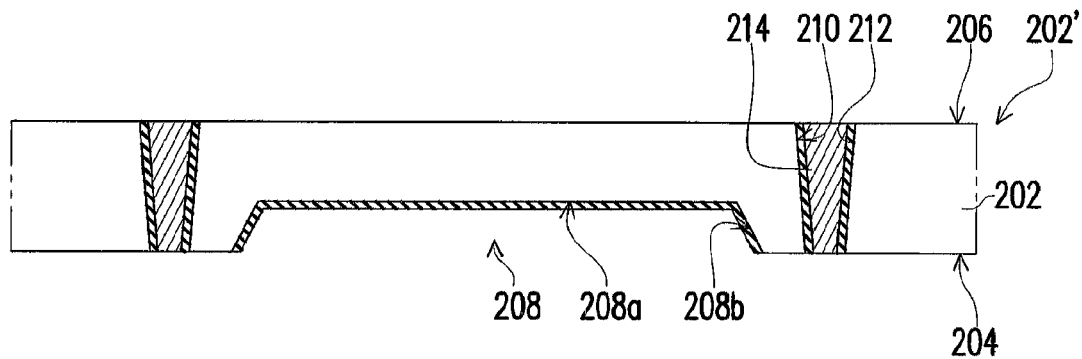

FIG. 5 is a sectional view of a crystal oscillator according to a fourth embodiment of the disclosure. Compared with the crystal oscillator 100 in FIG. 1A, in the crystal oscillator 100''' in FIG. 5, the crystal blank 120 is located in the hermetic chamber 140 and is connected to a chip conductive layer 138 of the IC chip 130 through the element conductive contact 116. Furthermore, in this embodiment, a plurality of parts of the chip conductive layer 138 also forms the conductive bonding ring 134a and the conductive bonding pads 134b of the conductive bonding area 134B respectively.

Figures 2, 3, 4, 5, 6:
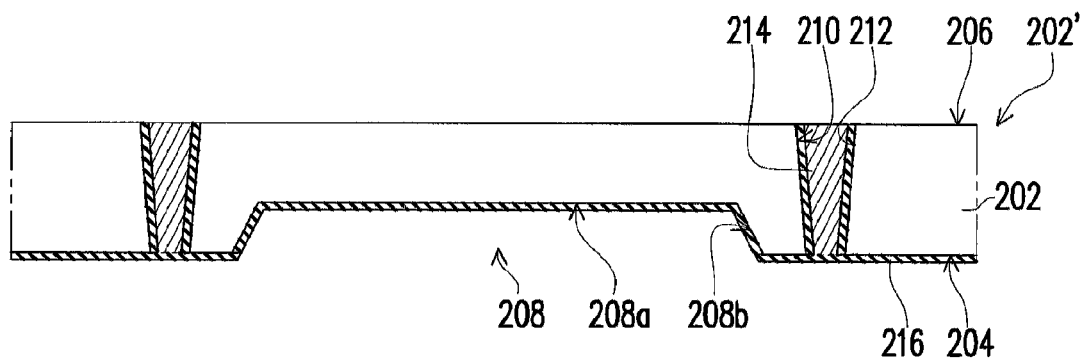
Figures 2, 3, 4, 5, 6, 7:
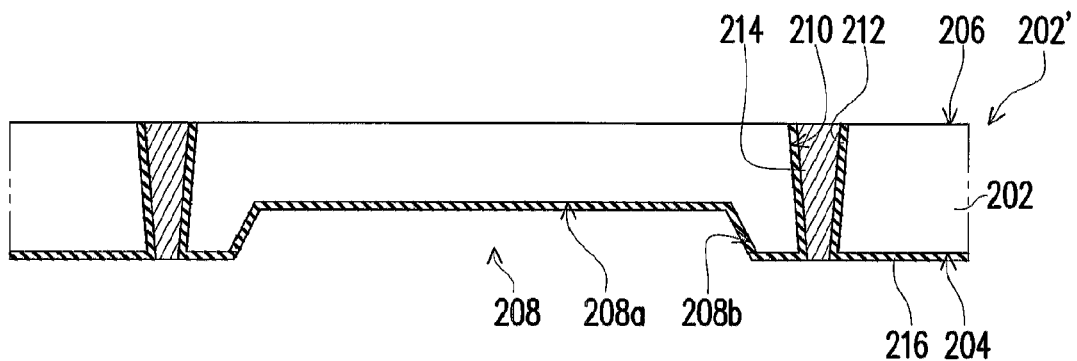
Figures 2, 3, 4, 5, 6, 7, 8:
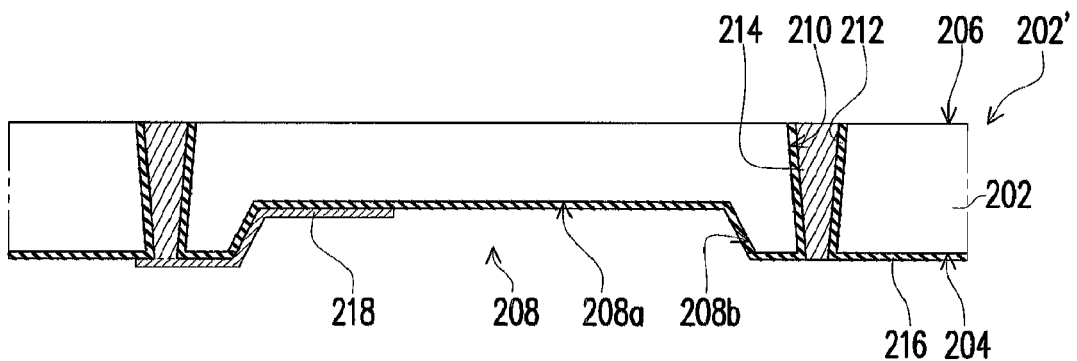
Figures 2, 3, 4, 5, 6, 7, 8, 9:
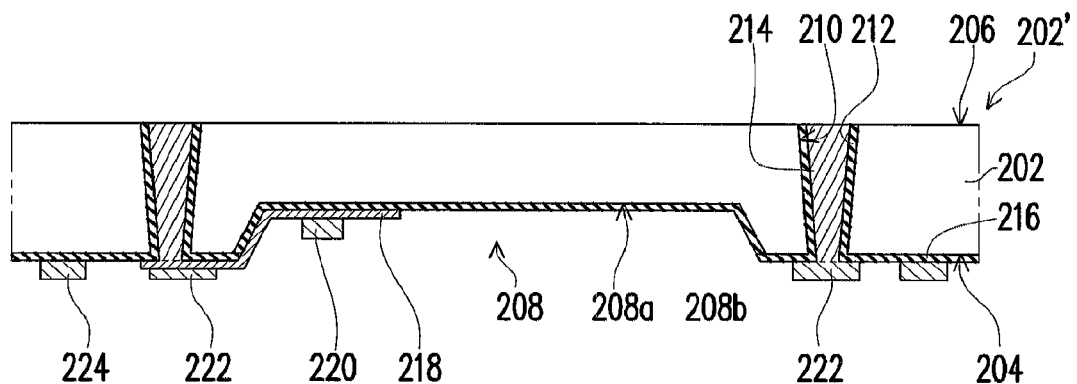
Figures 2, 3, 4, 5, 6, 7, 8, 9, 10:
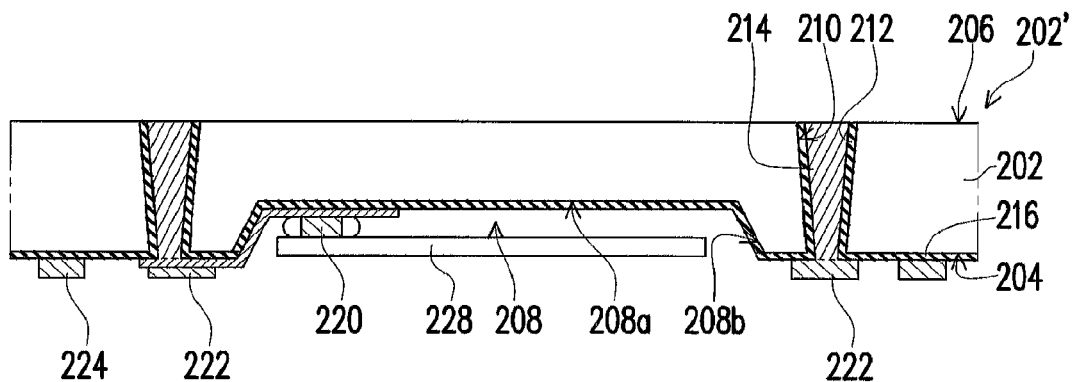
Figures 2, 3, 4, 5, 6, 7, 8, 9, 10, 11:
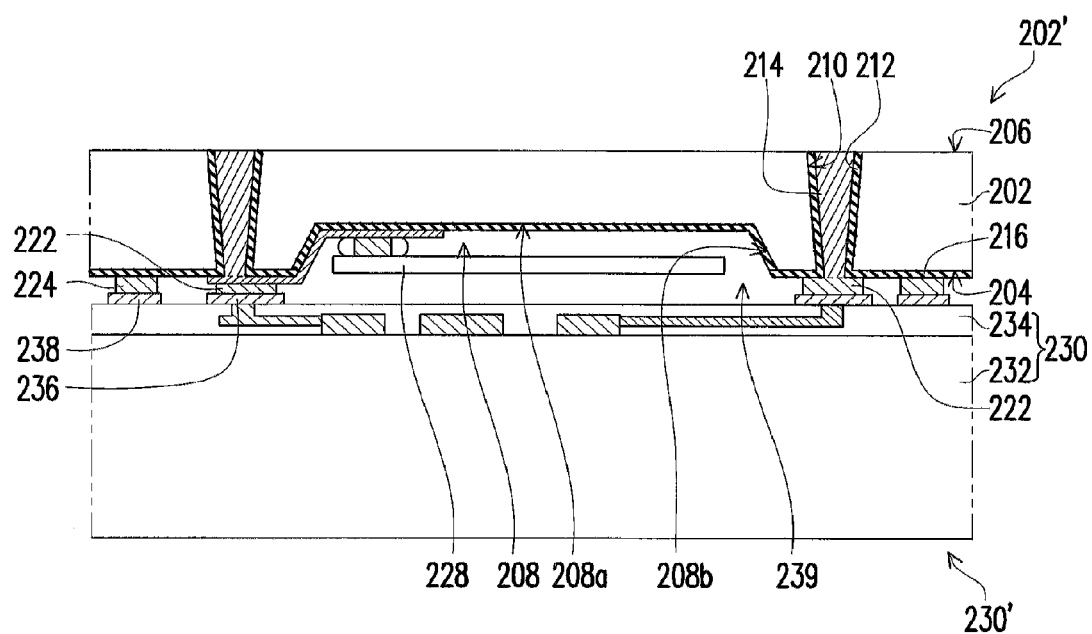
Figures 2, 3, 4, 5, 6, 7, 8, 9, 10, 11, 12:
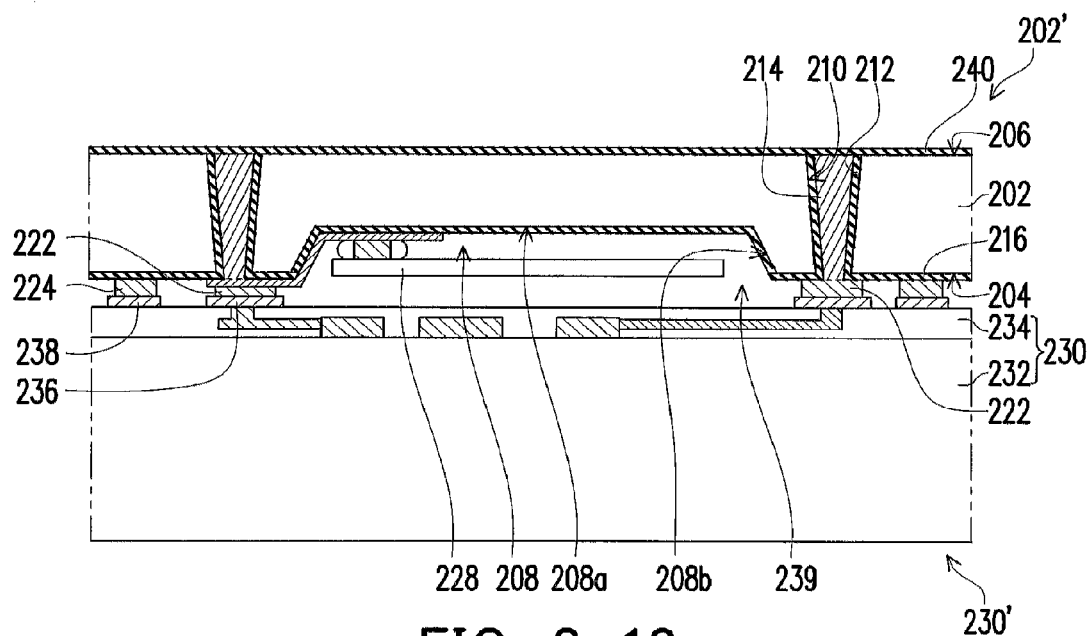
Figures 2, 3, 4, 5, 6, 7, 8, 9, 10, 11, 12, 13:
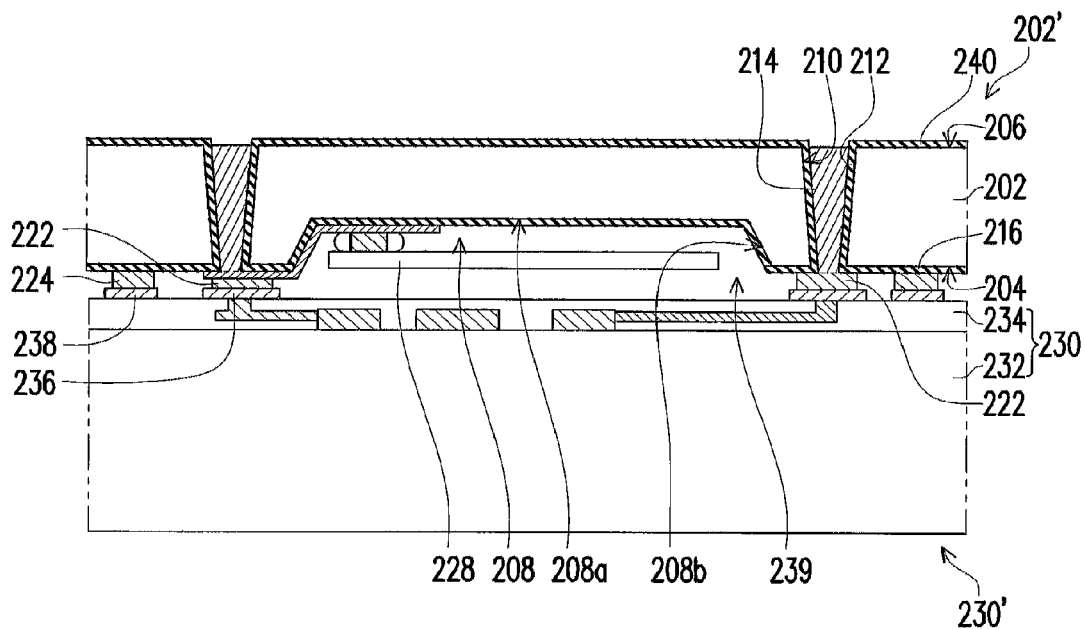
Figures 2, 3, 4, 5, 6, 7, 8, 9, 10, 11, 12, 13, 14:
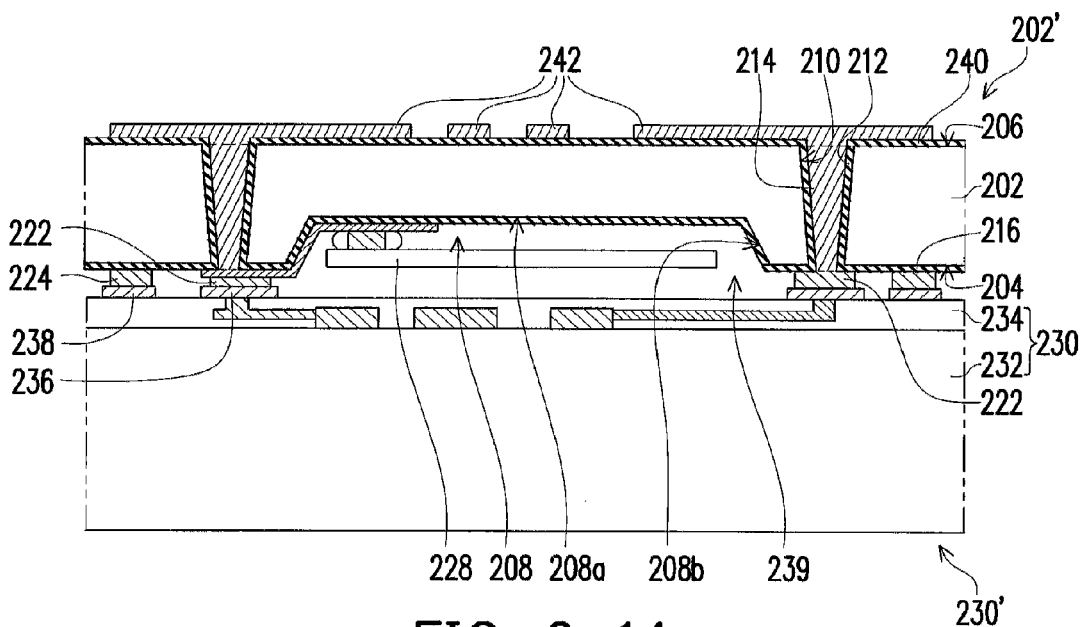
Figures 2, 3, 4, 5, 6, 7, 8, 9, 10, 11, 12, 13, 14, 15:
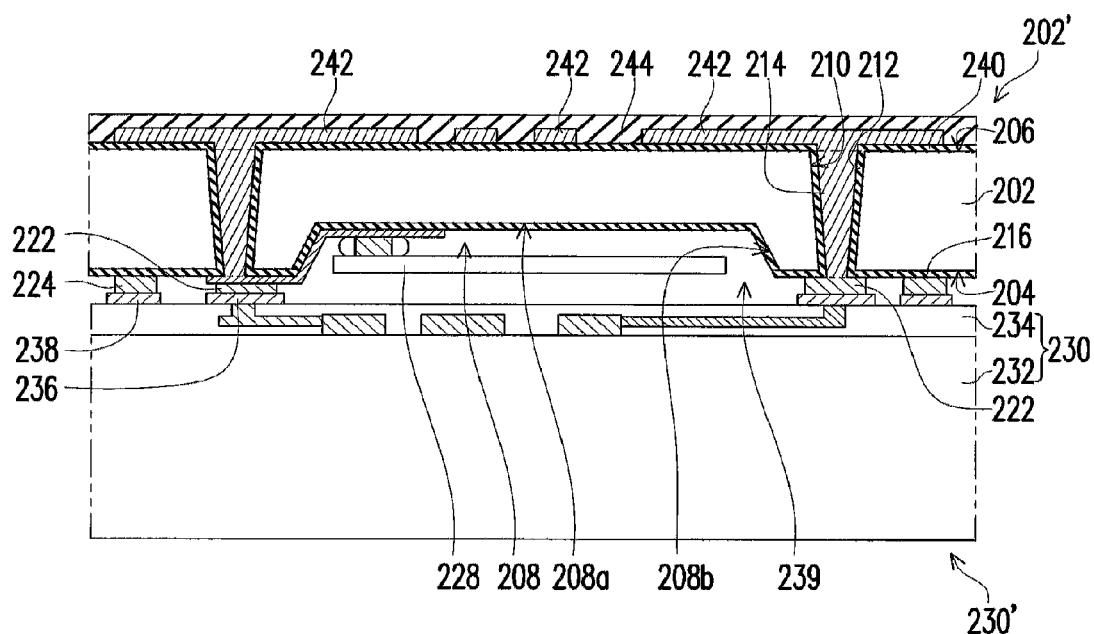
Figures 2, 3, 4, 5, 6, 7, 8, 9, 10, 11, 12, 13, 14, 15, 16:
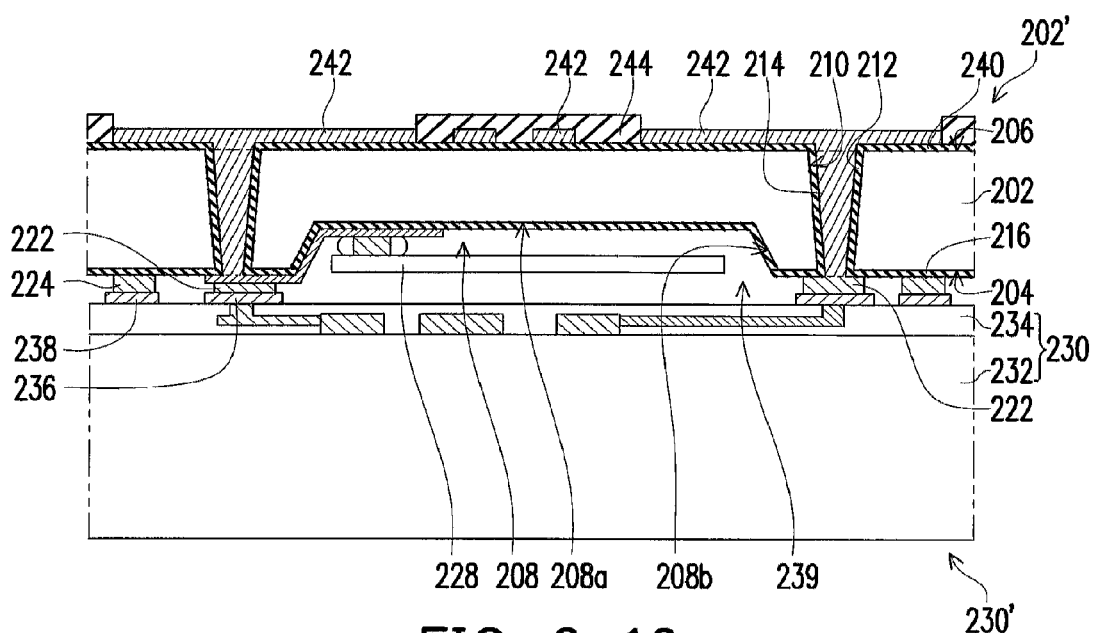
Figures 2, 3, 4, 5, 6, 7, 8, 9, 10, 11, 12, 13, 14, 15, 16, 17:
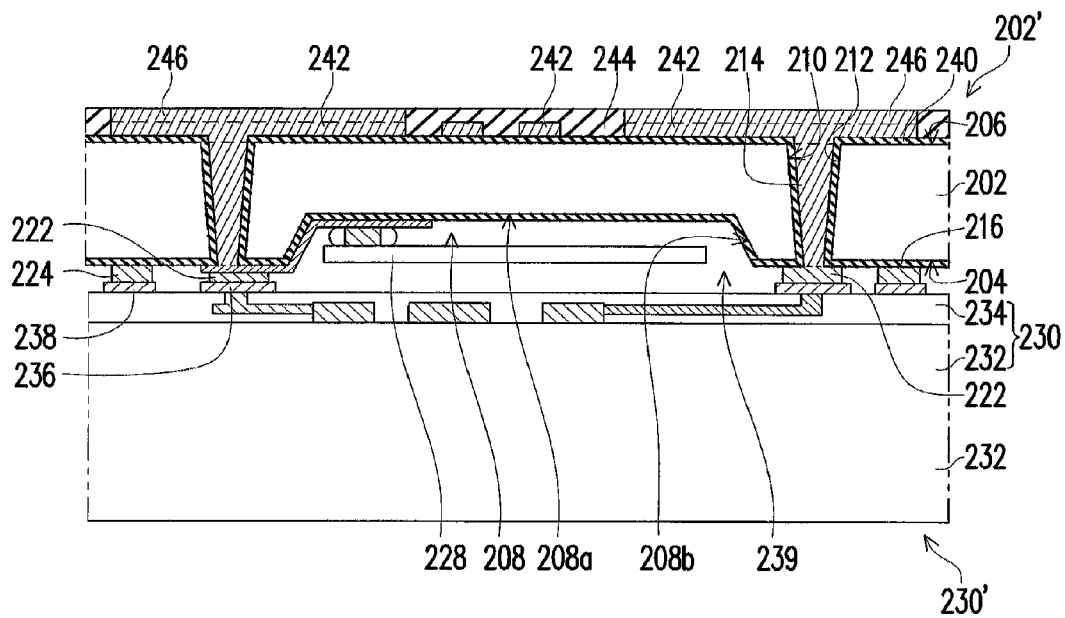
Figures 2, 3, 4, 5, 6, 7, 8, 9, 10, 11, 12, 13, 14, 15, 16, 17, 18:
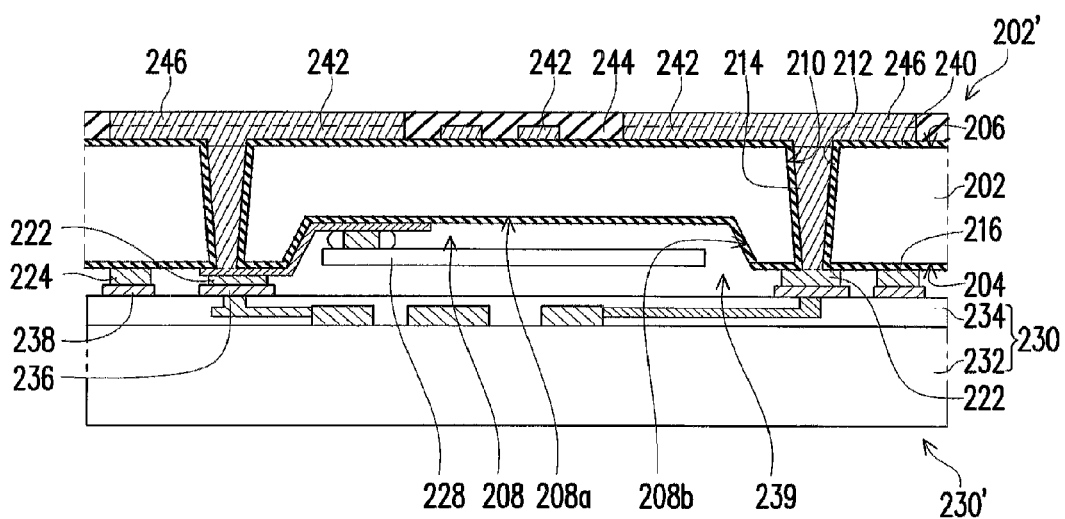
Figures 2, 3, 4, 5, 6, 7, 8, 9, 10, 11, 12, 13, 14, 15, 16, 17, 18, 19:
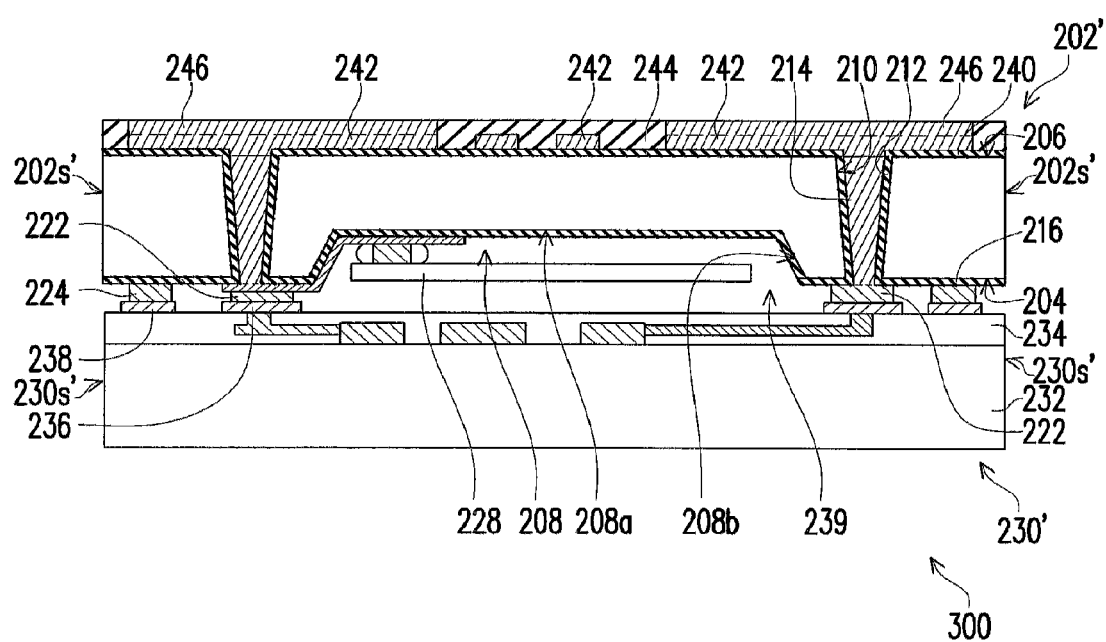
Figure 3:
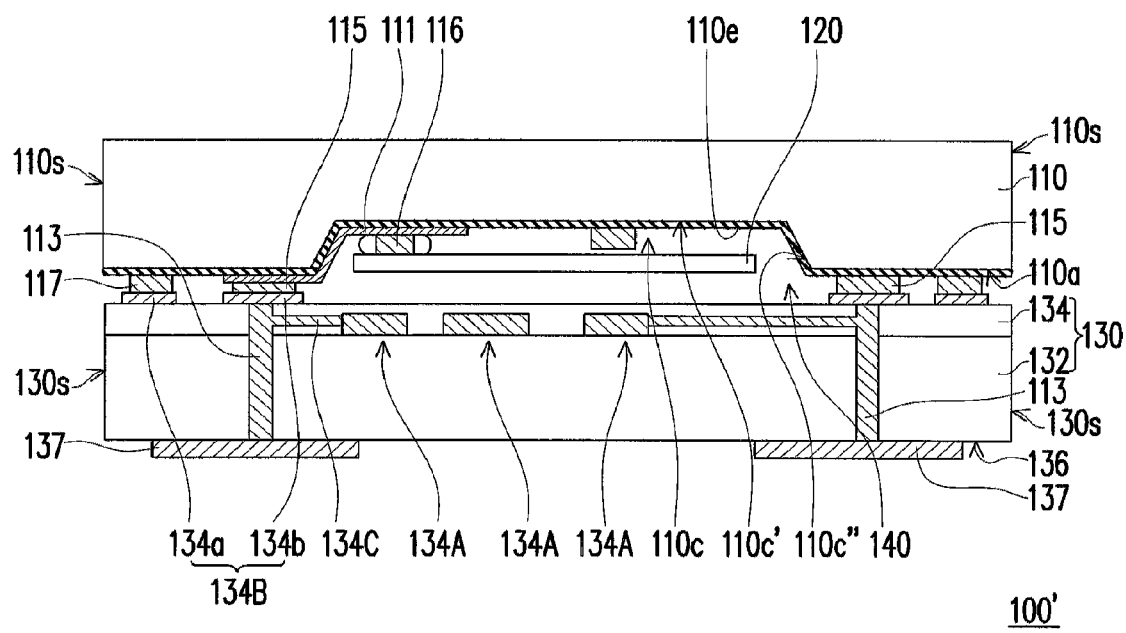
Figure 4:
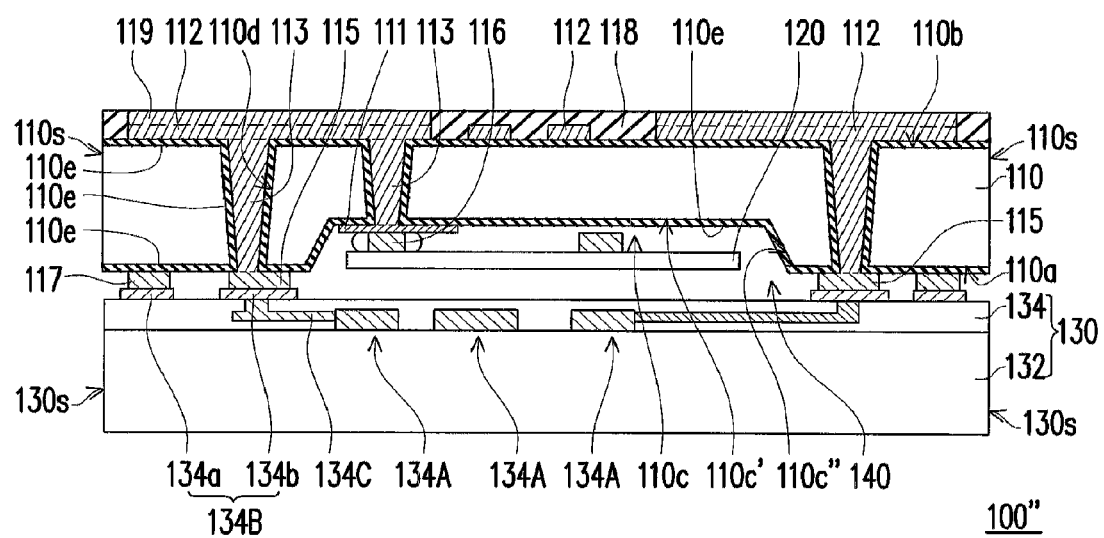
Figure 5:
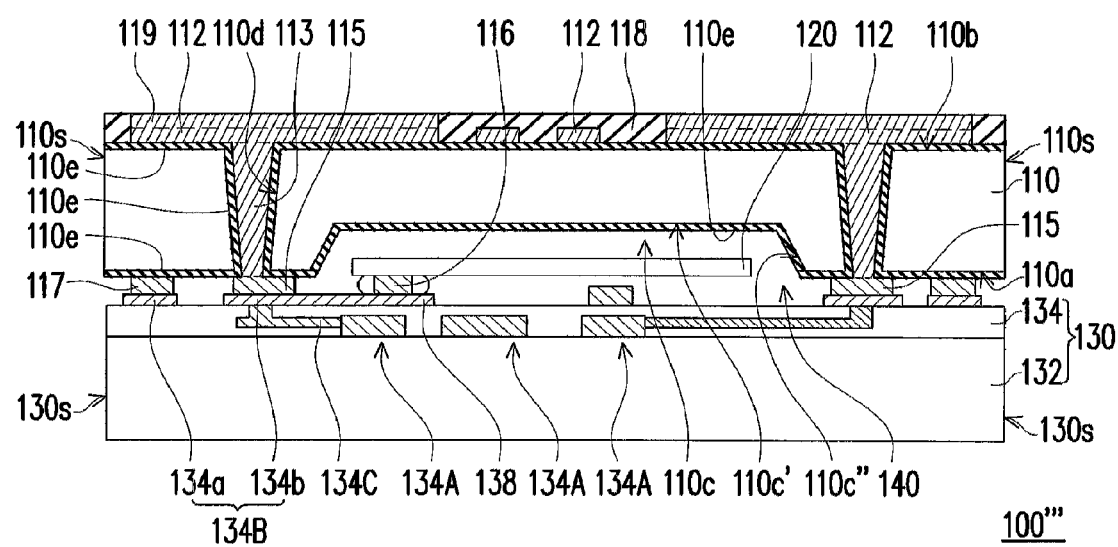
Figure 6:
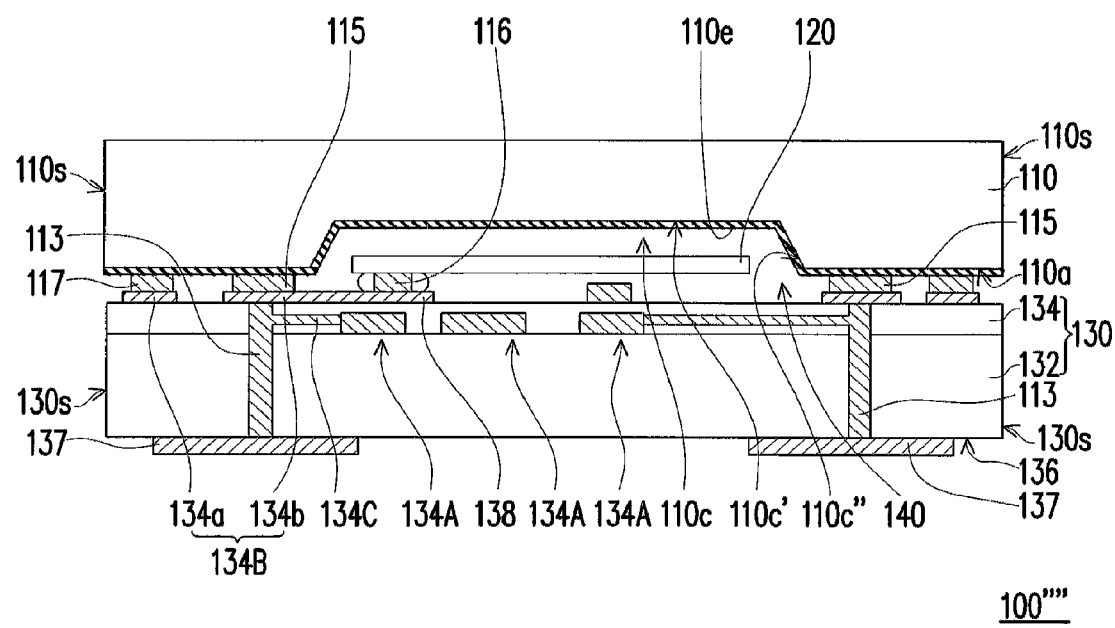

FIG. 6 is a sectional view of a crystal oscillator according to a fifth embodiment of the disclosure. Compared with the crystal oscillator 100''' in FIG. 5, in the crystal oscillator 100'''' in FIG. 6, the conductive pillars 113 penetrate the IC chip 130. Moreover, in this embodiment, the conductive pillars 113 are further connected to a plurality of chip bonding pads 137 on a back surface 136 of the IC chip 130 respectively so that an outward electrical connection channel can be formed through the conductive pillars 113.

In the crystal oscillator according to the disclosure, the conductive pillars penetrate the cover or the IC chip to serve as a vertical electrical paths, so that electrical path is shorten to reduce the noise of the electrical signal.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A crystal oscillator, comprising:
   a cover with a plurality of split side surfaces, comprising a first surface, a second surface, a cavity, a first cover conductive layer, an element conductive contact, a plurality of conductive contacts and a conductive sealing ring, wherein the second surface is opposite to the first surface, the cavity is formed in the first surface and comprises a bottom surface and a side surface surrounding the bottom surface, the first cover conductive layer is disposed on the bottom surface of the cavity, the element conductive contact is disposed on the first cover conductive layer, the conductive contacts are disposed on the first surface, and the conductive sealing ring is disposed on the first surface and surrounds the conductive contacts;
   a crystal blank, connected to the element conductive contact; and
   an Integrated Circuit (IC) chip with a plurality of split side surfaces, comprising a plurality of conductive bonding pads and a conductive bonding ring, wherein the conductive bonding pads and the conductive bonding ring are disposed on a surface of the IC chip, and the cover and IC chip are bonded by connecting the conductive sealing ring of the cover and the conductive bonding ring of the IC chip to form a hermetic chamber surrounding the crystal blank.

2. The crystal oscillator according to claim 1, further comprising:
   a plurality of conductive pillars, respectively penetrating the cover and connected to the conductive contacts, wherein the cover comprises a second cover conductive layer, an insulating layer and at least one conductive bonding layer, the second cover conductive layer is disposed on the second surface and is connected to at least one of the conductive pillars, the insulating layer is disposed on the second surface and on the second cover conductive layer, and the insulating layer exposes a part of the second cover conductive layer, and the conductive bonding layer is disposed on the exposed part of the second cover conductive layer.

3. The crystal oscillator according to claim 1, further comprising:
   a plurality of conductive pillars, respectively penetrating the cover and connected to the conductive contact, wherein the first cover conductive layer extends to the first surface along the side surface of the cavity and is connected to at least one of the conductive contacts.

4. The crystal oscillator according to claim 1, further comprising:
   a plurality of conductive pillars, respectively penetrating the IC chip, and each of the conductive pillars being connected to the corresponding conductive bonding pad and the corresponding conductive contact, wherein the first cover conductive layer extends to the first surface along the side surface of the cavity and is connected to at least one of the conductive contacts.

5. The crystal oscillator according to claim 1, further comprising:
   a plurality of conductive pillars, respectively penetrating the cover, wherein at least one of the conductive pillars penetrates to the bottom surface of the cavity, and is connected to the first cover conductive layer.

6. A crystal oscillator, comprising:
   a cover with a plurality of split side surfaces, comprising a first surface, a second surface, a cavity, a plurality of conductive contacts and a conductive sealing ring, wherein the second surface is opposite to the first surface, the cavity is formed in the first surface and comprises a bottom surface and a side surface surrounding the bottom surface, the conductive contacts are disposed on the first surface, and the conductive sealing ring is disposed on the first surface and surrounds the conductive contacts;
   an Integrated Circuit (IC) chip with a plurality of split side surfaces, comprising a plurality of conductive bonding pads and a conductive bonding ring, wherein the conductive bonding pads and the conductive bonding ring are disposed on a surface of the IC chip, and the cover and IC chip are bonded by connecting the conductive sealing ring of the cover and the conductive bonding ring of the IC chip to form a hermetic chamber;
   a conductive layer, disposed in the hermetic chamber and electrically connected to at least one of the conductive contacts;
   an element conductive contact, located in the hermetic chamber and disposed on the conductive layer; and
   a crystal blank, located in the hermetic chamber and disposed on the element conductive contact.

7. The crystal oscillator according to claim 6, wherein the element conductive contact is disposed on a surface of the IC chip.

8. The crystal oscillator according to claim 6, further comprising:
   a plurality of conductive pillars, respectively penetrating the cover and each of the conductive pillars connected to the corresponding conductive contact and the corresponding conductive bonding pad.

9. The crystal oscillator according to claim 6, further comprising:
   a plurality of conductive pillars, respectively penetrating the IC chip and each of the conductive pillars connected to the corresponding conductive bonding pad and the corresponding conductive contact.

10. A method for manufacturing a crystal oscillator, comprising:
    providing a cover wafer and an Integrated Circuit (IC) wafer, the cover wafer having a plurality of covers and the IC wafer having a plurality of IC chips corresponding to the covers respectively;
    connecting the cover wafer and the IC wafer by a plurality of conductive sealing rings, each of the conductive sealing rings located between the corresponding cover and the corresponding IC chip to form a hermetic chamber; and locating a crystal blank in each of the hermetic chamber, wherein each of the covers comprises a first surface, a cavity and a plurality of conductive contacts, the cavity is formed in the first surface and forms part of the hermetic chamber, the conductive sealing ring is disposed on the first surface, each of the IC chips comprises a silicon substrate, an IC layer disposed on the silicon substrate, and a conductive bonding ring connected to the conductive sealing ring, wherein each of the covers further comprises a first cover conductive layer, an element conductive contact and a plurality of conductive contacts, the first cover conductive layer is disposed on a bottom surface of the cavity and extends from a side surface of the cavity to the first surface, the element conductive contact is disposed in the cavity and is connected to the first cover conductive layer, the conductive contacts are disposed on the first surface and connected to the first cover conductive layer, the conductive sealing ring surrounds the conductive contacts, each of the IC chips further comprises a plurality of conductive bonding pads, and the conductive bonding pads are connected to the conductive contacts respectively.

11. The method for manufacturing the crystal oscillator according to claim 10, wherein each of the covers further comprises a second surface and a plurality of conductive pillars, the second surface is opposite to the first surface, the conductive pillars respectively penetrate the cover and connect the first surface and the second surface, and at least one of the conductive pillars is electrically connected to the first cover conductive layer.

12. The method for manufacturing the crystal oscillator according to claim 10, further comprising:
performing a wafer dicing process on the cover wafer and the IC wafer connected to the cover wafer to form a plurality of crystal oscillators, each of the crystal oscillators including one of the covers, the corresponding one of the IC chips and one of the crystal blanks in the hermetic chamber.

13. A method for manufacturing a crystal oscillator, comprising:
providing a cover wafer and an Integrated Circuit (IC) wafer, the cove wafer having a plurality of covers and the IC wafer having a plurality of IC chips corresponding to the covers respectively;
connecting a crystal blank on each of the covers; and
connecting the cover wafer and the IC wafer by a plurality of conductive sealing rings, each of the conductive sealing rings being located between the corresponding cover and the corresponding IC chip to faun a hermetic chamber surrounding the corresponding crystal blank,
wherein the step of providing the cover wafer comprises:
etching each of the covers to form a cavity and a plurality of blind holes, wherein each of the covers comprises a first surface and a second surface, and the second surface is opposite to the first surface, the cavity is formed in the first surface, and the blind holes are formed in the second surface;
insulating a bottom surface of the cavity and inner surfaces of the blind holes;
forming a plurality of conductive pillars in the blind holes respectively with a metal plating process;
thinning the first surface of each of the covers to expose an end surface of each of the conductive pillars at the first surface;
depositing a first insulator on the first surface;
removing part of the first insulator that is located on the end surface of at least one of the conductive pillars at the first surface to expose the end surface of the conductive pillar at the first surface;
forming a first cover conductive layer on the bottom surface of the cavity, wherein the first cover conductive layer is extended to the first surface through the side surface and is connected to the at least one of the conductive pillars; and
forming an element conductive contact, a plurality of conductive contacts and the conductive sealing ring, wherein the element conductive contact is located in the cavity and is connected to the first cover conductive layer, the conductive contacts are disposed on the first surface, and the conductive sealing ring is disposed on the first surface and surrounds the conductive contacts.

14. The method for manufacturing the crystal oscillator according to claim 13, the step of providing the cover wafer further comprising:
depositing a second insulator on the second surface;
removing part of the second insulator located on the end surface of at least one of the conductive pillars at the second surface to expose the end surface of the conductive pillar at the second surface;
forming a second cover conductive layer on the second surface, wherein the second cover conductive layer is connected to the at least one of the conductive pillars;
forming an insulating layer on the second surface and the second cover conductive layer, the insulating layer exposing a part of the second cover conductive layer; and
forming at least one conductive bonding layer on the part of the second cover conductive layer exposed by the insulating layer.

15. The method for manufacturing the crystal oscillator according to claim 13, further comprising:
thinning each of the IC chips.

16. The method for manufacturing the crystal oscillator according to claim 13, wherein the cover wafer is a silicon wafer.

17. The method for manufacturing the crystal oscillator according to claim 13, further comprising:
performing a wafer dicing process on the cover wafer and the IC wafer connected to the cover wafer to form a plurality of crystal oscillators, each of the crystal oscillators including one of the covers, the corresponding one of the IC chips and one of the crystal blanks in the hermetic chamber.

* * * * *